United States Patent [19]

Kikuchi et al.

[11] Patent Number: 5,141,450
[45] Date of Patent: Aug. 25, 1992

[54] TAPE CARRIER TYPE ELECTRICAL CONNECTOR

[76] Inventors: Shoji Kikuchi, 43-4, Sengokugashi, Hiratsuka-shi, Kanagawa; Junichi Tanigawa, 3-12-1-A201, Katahira, Asao-ku, Kawasaki-shi, Kanagawa, both of Japan

[21] Appl. No.: 728,788

[22] Filed: Jul. 3, 1991

Related U.S. Application Data

[63] Continuation of Ser. No. 587,390, Sep. 25, 1990, abandoned.

[30] Foreign Application Priority Data

Sep. 26, 1989 [JP] Japan ................... 1-111688

[51] Int. Cl.⁵ .......................................... H01R 13/73
[52] U.S. Cl. ........................ 439/560; 439/885; 206/330
[58] Field of Search .............. 439/83, 84, 571–573, 439/937, 494, 885, 560; 206/330

[56] References Cited

U.S. PATENT DOCUMENTS

| | | | |
|---|---|---|---|
| 2,998,130 | 8/1961 | Lehner | 206/330 |
| 3,573,719 | 4/1971 | Lightner | 439/494 |
| 4,169,649 | 10/1979 | Henley et al. | 439/937 |
| 4,195,900 | 4/1980 | Hughes | 439/571 |
| 4,391,482 | 7/1983 | Czeschka | 439/937 |
| 4,530,552 | 7/1985 | Meehan et al. | 439/68 |
| 4,600,116 | 7/1986 | Inano et al. | 206/330 |
| 4,655,517 | 4/1987 | Bryce | 439/571 |
| 4,721,470 | 1/1988 | Humphrey | 439/573 |
| 4,776,811 | 10/1988 | Humphrey | 439/571 |

FOREIGN PATENT DOCUMENTS

| | | | |
|---|---|---|---|
| 0147749 | 4/1981 | German Democratic Rep. | 439/84 |
| 114776 | 7/1984 | Japan . | |
| 57383 | 4/1987 | Japan . | |
| 62668 | 4/1989 | Japan . | |

*Primary Examiner*—Larry I. Schwartz
*Assistant Examiner*—Kevin J. Carroll

[57] ABSTRACT

A pair of support pins (16) extending outwardly from a connector housing (10) has been disclosed. The pins (16) are attached in the housing (10) and do not carry an electrical current but instead are used to retain the electrical connector on carrier tape and to support the connector on a circuit board (30) during soldering.

2 Claims, 1 Drawing Sheet

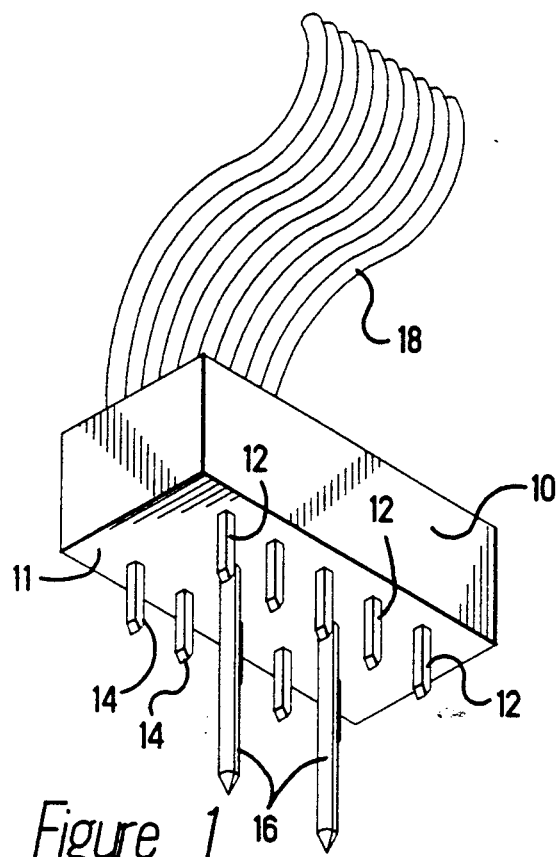
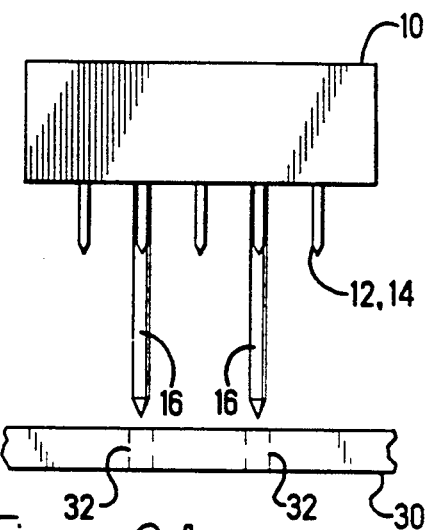
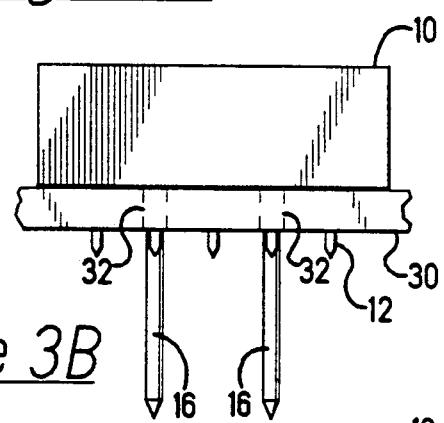
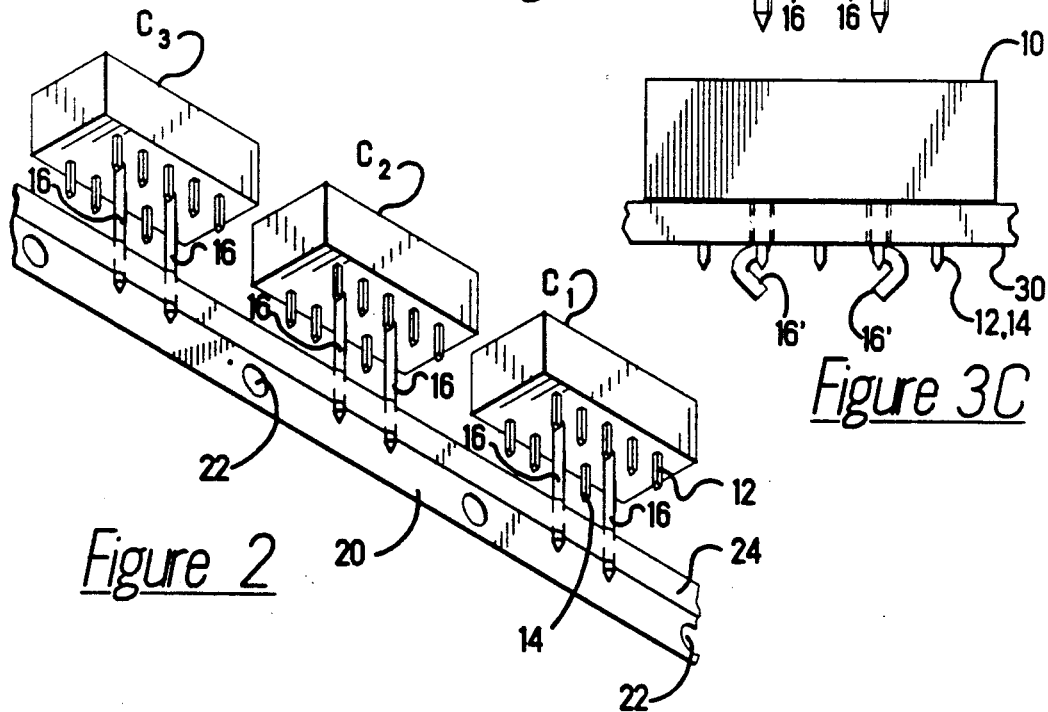
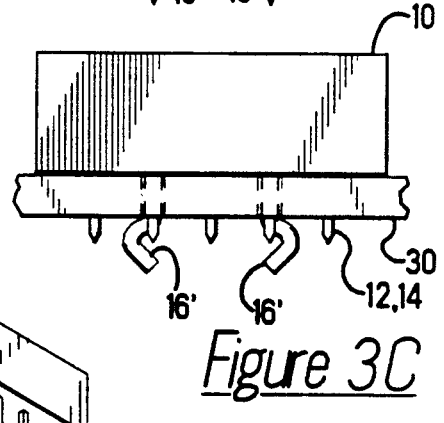

TAPE CARRIER TYPE ELECTRICAL CONNECTOR

This application is a continuation of application Ser. No. 07/587,390 filed Sept. 25, 1990, now abandoned.

FIELD OF THE INVENTION

The present invention pertains to electrical connectors, particularly those to be attached to and used with circuit boards.

BACKGROUND OF THE INVENTION

In order to lower the manufacturing cost in the mass production of electrical equipment, particularly home electronic goods such as television receivers and video tape recorders (VCR), automated assembly machines such as robots have been introduced. As a result, automated supply, assembly, and flow soldering operations dealing not only with active electronic components such as semiconductor devices but also with passive components such as resistors and condensers held by carrier tape have become commonplace.

In such electrical equipment, a great number of electric connectors are utilized to provide for easy connection and release of ribbon cable or flexible circuit connections boards with printed circuit boards, or for reciprocal connections between circuit boards, or for connections with other devices (such as CRTs, switches, motors, etc.). (For example, see Patent Report No. 59-114776 or Utility Report No. 62-57383.)

However, no carrier tape type electrical connector existed to make possible the automated mounting of high density packaging devices with a large number of pins. The reason for this is that, hitherto, electrical connectors, unlike the above noted resistors etc., did not have two or more lead lines so that they could be secured to a tape. Furthermore, the terminals and contact points of previous electrical connectors were often of one unit, usually punched out of flexible metal sheets. The option of using a tape carrier with such electrical connectors presents functional and manufacturing cost problems.

Consequently, it was necessary to develop a tape carrier type electrical connector to make automated machine assembly possible, just as was being done with other active and passive electronic components.

SUMMARY OF THE INVENTION

According to the invention, an electrical connector is provided with a pair of support pins which extend outwardly from a surface. The pins retain the connector on carrier tape and further are inserted into holes in a circuit board to support the connector during the soldering of terminals on the connector to the board.

BRIEF DESCRIPTION OF THE DRAWINGS

FIG. 1 is an enlarged, oblique view of a tape carrier type electrical connector according to the present invention;

FIG. 2 is a drawing of the electrical connectors of FIG. 1 held by a tape carrier; and FIG. 3 from (A) to (C) shows the process whereby an electrical connector of the present invention is attached to a circuit board.

DESCRIPTION OF THE INVENTION

FIG. 1 is an enlarged, oblique, cross-angle view of one example of the tape carrier type electrical connector of the present invention. In this electrical connector, a number of terminals (for instance, a total of 10) are arranged in lines and firmly inserted and held in place by the receiving cavities (not shown) of the non-conductive housing (10). The conducting pin terminals (12) and (14) are arrayed in two lines, protruding from the lower surface (11) of housing (10). The tips of each of the terminal pins (12) and (14) are very fine, constructed so as to permit easy insertion into the openings of a printed circuit board. The upper surface of housing (10) has multiple openings, constructed, for example, so the terminal pins can make an electrical connection with the bare ends of the conducting wires of ribbon cable (18). Such an electrical connector is the same as prior electrical connectors for flat cable described above. The dimensions of the housing (10) might be, for example, 15×7×5 mm.

The electrical connector of the present invention has, in addition to the structure described above, multiple, but preferably two, support pins (16) affixed to the lower surface (11) of housing (10), separate from terminals (12) and (14). "The support pins (16) are longer than the terminals (12) and (14) as shown in the drawing." The support pins (16) are, for example, round plated copper wire, but it is of course possible to use wire of a different shape or material. For this one example of the present invention, the support pins (16) may be pressed into and fixed in small holes formed in the lower surface (11) of non-conductive housing (10) or may be formed in advance as one unit with housing (10). An extraction strength of over 1.5 kg per each pressed and fixed support pin (16) has been confirmed. The normal line of support pins (16) with respect to the lower surface (11) of non-conductive housing (10) is to protrude toward the circuit board side. When the connector is separated from the carrier tape, it is desirable to use a tapering process on the tips (free ends) of the support wires to facilitate insertion into the openings on the circuit board.

FIG. 2 is an abbreviated drawing showing electrical connectors according to the present invention attached to carrier tape (20) ready for an automated supply and assembly process. Carrier tape (20) is generally a relatively thick paper with openings (22) at designated intervals for use with sprockets, and a relatively narrow strip of one-sided adhesive tape (24) attached. At set intervals along this adhesive strip (24) of carrier tape (20), electrical connectors according to the present invention $C_1$, $C_2$, $C_3$, . . . are held in place near the free ends of support pins (16). Electrical connectors $C_1$, $C_2$, . . . held by carrier tape (20) can, as required, be either rolled into a reel and stored, or furnished to an automated supply or assembly machine.

FIG. 3 (A), (B) and (C) show frontal views indicating the process by which carrier type electrical connectors according to the present invention are attached and fixed to a circuit board. In FIG. 3 (A), the electrical connector C has been removed from carrier tape (20) and the tips of support pin (16) are being inserted into attachment holes (32) of circuit board (30). At this point, the hand of an assembly machine (robot) would be clasping the non-conductive housing (10), but it is omitted in this drawing. (B) of the same Figure shows the condition when, guided by support pins (16), all the terminal pins (12) and (14) are inserted into the through holes (not shown) of circuit board (30). Figure (C) shows the condition when the support pins (16) have protruded from the underside of circuit board (30) and been cut and bent at approximately 2 mm in a process called "kinking," temporarily fixing electrical connector C to circuit board (30). Subsequently, when a flow solder process is executed, each of the terminal pins (12) and (14) of electrical connector C will be electrically connected with circuit board (30) conductors, that is, with the through holes or conductive pads, etc.

Note also, if attachment holes (32) of circuit board (30) are plated through holes, support pins (16) will also be completely and firmly fixed to circuit board (30). Moreover, as noted above, because of the substantial holding strength of the support pins (16) when attached this way, this is an effective method for strengthening the durability of electrical connectors when numerous ribbon cables must frequently be connected and disconnected. Also, the present invention can be applied in a similar fashion in the case of surface mount type (SMT) electrical connectors, when terminal pins such as described above are not used. In this situation since there is a danger of insufficient holding strength, the support pins 16 are very effective in improving reliability.

As can be seen from the above explanation, the electrical connector of the present design has, in addition to the terminal pins, separate support pins placed along the mid-line of the housing. Consequently, due to these support pins, automated supply and assembly of circuit boards with tape carrier type electrical connectors is now possible. The present invention adds functionality by providing a guide when mounting, a temporary holding method, and supplementary holding power. It possesses, furthermore, a remarkable effectiveness in practical application lending itself easily to various quantities, dimensions and terminal structures.

We claim:

1. A strip of electrical connectors, comprising:
   electrical connectors each having a dielectric housing including at least one row of electrical terminals secured in said housing, said terminals having upper ends adapted to be connected to other conductors and post sections of said terminals extending outwardly from a bottom surface of said housing for disposition in holes in a circuit board;
   at least two support pins having inner ends secured in holes in said bottom surface of the housing at substantially symmetrical locations in said housing and outer ends longer in length than said post sections, said outer ends entering the circuit board and leading, guiding and positioning, the post sections and said housing with said post sections entering holes of the circuit board, said support pins having a section readily bendable transverse to the plane of the circuit board to lock the housing and post sections in position for subsequent soldering to the circuit board with minimum stress to said terminals; and
   a carrier member including securing means thereon securing said support pins to said carrier member such that said electrical connectors are located at spaced intervals along said carrier member.

2. The strip of electrical connectors of claim 1 wherein said securing means include an adhesive tape on said carrier member.

* * * * *